(12) United States Patent  
Wenzel et al.

(10) Patent No.: US 8,912,667 B2  
(45) Date of Patent: Dec. 16, 2014

(54) PACKAGED INTEGRATED CIRCUIT USING WIRE BONDS

(75) Inventors: Robert J. Wenzel, Austin, TX (US); Kevin J. Hess, Austin, TX (US); Chu-Chung Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 102 days.

(21) Appl. No.: 13/362,636

(22) Filed: Jan. 31, 2012

(65) Prior Publication Data

US 2013/0193589 A1   Aug. 1, 2013

(51) Int. Cl.
*H01L 29/40* (2006.01)
*H01L 21/44* (2006.01)
*H01L 23/532* (2006.01)
*H01L 21/02* (2006.01)
*H01L 23/00* (2006.01)

(52) U.S. Cl.
CPC ...... *H01L 23/5329* (2013.01); *H01L 21/02126* (2013.01); *H01L 24/85* (2013.01)
USPC .......................................... 257/784; 438/617

(58) Field of Classification Search
CPC ..... H01L 24/42; H01L 24/85; H01L 23/5329; H01L 21/02126
USPC ............................ 257/774, 784; 438/125, 617
See application file for complete search history.

(56) References Cited

U.S. PATENT DOCUMENTS

| | | | |
|---|---|---|---|
| 5,662,263 A * | 9/1997 | Urushima | 228/102 |
| 6,177,726 B1 * | 1/2001 | Manteghi | 257/725 |
| 6,340,846 B1 | 1/2002 | Lo Bianco et al. | |
| 6,465,896 B1 * | 10/2002 | Norskov et al. | 257/784 |
| 6,608,390 B2 * | 8/2003 | Beatson et al. | 257/784 |
| 6,822,340 B2 | 11/2004 | Lamson et al. | |
| 6,847,122 B1 | 1/2005 | Batish et al. | |
| 6,955,949 B2 * | 10/2005 | Batish et al. | 438/125 |
| 7,195,954 B2 | 3/2007 | Lamson et al. | |
| 7,374,971 B2 | 5/2008 | Yuan et al. | |
| 7,541,222 B2 * | 6/2009 | Magno et al. | 438/125 |
| 2006/0189119 A1 | 8/2006 | Jin | |
| 2010/0025864 A1 | 2/2010 | Bailey et al. | |

OTHER PUBLICATIONS

Tim J. Wooster et al., "Thermal, mechanical, and conductivity properties of cyanate ester composites", Composites, Part A: applied science and manufacturing, Elsevier, 2004, pp. 75-82.*

Todd et al., "Molecular Basis of the Interphase Dielectric Properties of Microelectronic and Optoelectronic Packaging Materials", IEEE, Transactions on Components and Packaging Technologies, vol. 26, No. 3, Sep. 2003, pp. 667-672.*

* cited by examiner

*Primary Examiner* — William D Coleman
(74) *Attorney, Agent, or Firm* — James L. Clingan, Jr.; Mary Jo Bertani

(57) ABSTRACT

A semiconductor device includes an integrated circuit die on a substrate. A first subset of wire bonds is between the substrate and the die. A second subset of wire bonds is between the substrate and the die. A dielectric material coats the first subset of the wire bonds along a majority of length of the first subset of the wire bonds. A medium is in contact with the second subset of the wire bonds along a majority of length of the second subset of the wire bonds.

18 Claims, 3 Drawing Sheets

PACKAGED INTEGRATED CIRCUIT USING WIRE BONDS

BACKGROUND

1. Field

This disclosure relates generally to packaged integrated circuits, and more specifically, to packaged integrated circuits having wirebonds.

2. Related Art

Integrated circuits have a variety of issues relating to further developments in reducing dimensions. One continuing issue is high frequency performance as wires become closer together while maintaining reliable packaging. In plastic packaging, for example, a molding flow typically causes wire sweep which must be taken into account in making changes to improve performance. Improvements in speed are continuously pursued which can be adversely impacted by wires in close proximity to each other. Additionally, an impedance mismatch can adversely impact overall performance of a circuit.

Accordingly, there is a need for integrated circuit packaging that improves upon one or more of the issues referenced above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A packaged integrated circuit has a plurality of wires that are wire bonded to an underlying surface in which wires are selectively coated with an insulator having a dielectric constant different from a dielectric constant of a die encapsulant of the packaged integrated circuit. Thus some wires of the plurality of wires are in contact with the encapsulant and some are in contact with the insulator. This is better understood by reference to the drawings and the following written description.

Figure 1:
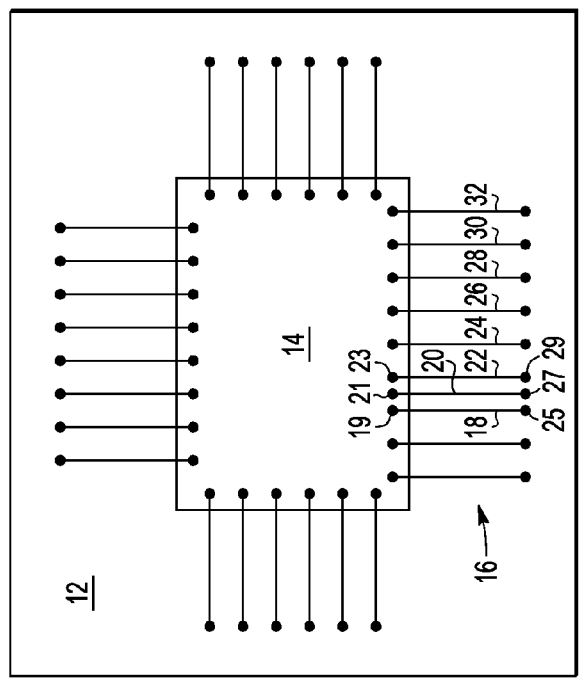
FIG. 1 is a top view of an integrated circuit wire bonded to an underlying surface which may be a top surface of a substrate.

Shown in FIG. 1 is, in a top view, a semiconductor device 10 having a package substrate 12, an integrated circuit 14 attached to package substrate 12, and wires 16 wire bonded between integrated circuit 14 and package substrate 12. Examples of wires 16 are wires 18, 20, 22, 24, 26, 28, 30, and 32. Wires 18, 20, 22, 24, 26, 28, 30, and 32 are connected to integrated circuit 14 and package substrate 12 at contact points. Contact points may be ball bond or a wedge bond. Most commonly, a ball bond is used on the integrated circuit side and a wedge bond is used on the package substrate side. Exemplary contact points are contact points 19, 21, and 23 on integrated circuit 14 and contact points 25, 27, and 29 on package substrate 12. Wire 18 is attached to integrated circuit 14 at contact point 19 and to package substrate 12 at contact point 25. Wire 20 is attached to integrated circuit 14 at contact point 21 and to package substrate 12 at contact point 27. Wire 22 is attached to integrated circuit 14 at contact point 23 and to package substrate 12 at contact point 29.

Figure 2:
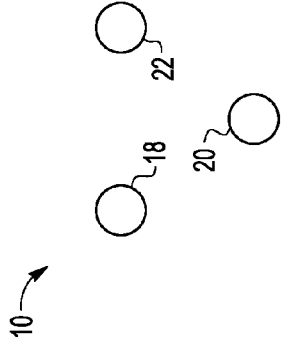
FIG. 2 is a cross section of a plurality of wires of the wire bonding between the integrated circuit and the underlying surface at a stage in processing.

Shown in FIG. 2 is a cross section of wires 18, 20, 22, 24, 26, 28, 30, and 32 of semiconductor device 10 showing that wires 18 and 22 are at the same height and that wire 20 is below and approximately centered between wires 18 and 22. Wires 22, 24, 26, 28, 30, and 32 are in a line of wires adjacent to wire 22. Wires 22, 24, 26, 28, 30, and 32 are spaced approximately equally from each other but wire 24 has a greater spacing from wire 22 than the nearly equal spacing of wires 22, 24, 26, 28, 30, and 32. Wires 18 and 22 are approximately equally spaced from wire 20. The arrangement of wires 18, 20, and 22 is particularly beneficial for the case where wires 18 and 22 carry complementary signals and wire 20 carries a reference. The reference may be ground. Wires 24 and 26 may be for carrying a positive power supply voltage such as VDD and a negative power supply voltage such as VSS, respectively. VSS may be ground. Negative power supply voltage in this context has a voltage lower than VDD and is used for a powering a circuit in which current passes from VDD to VSS. What is present in any region surrounding a subset can be considered a medium which may be a low or high k dielectric, encapsulant, or even vacuum.

Figure 3:
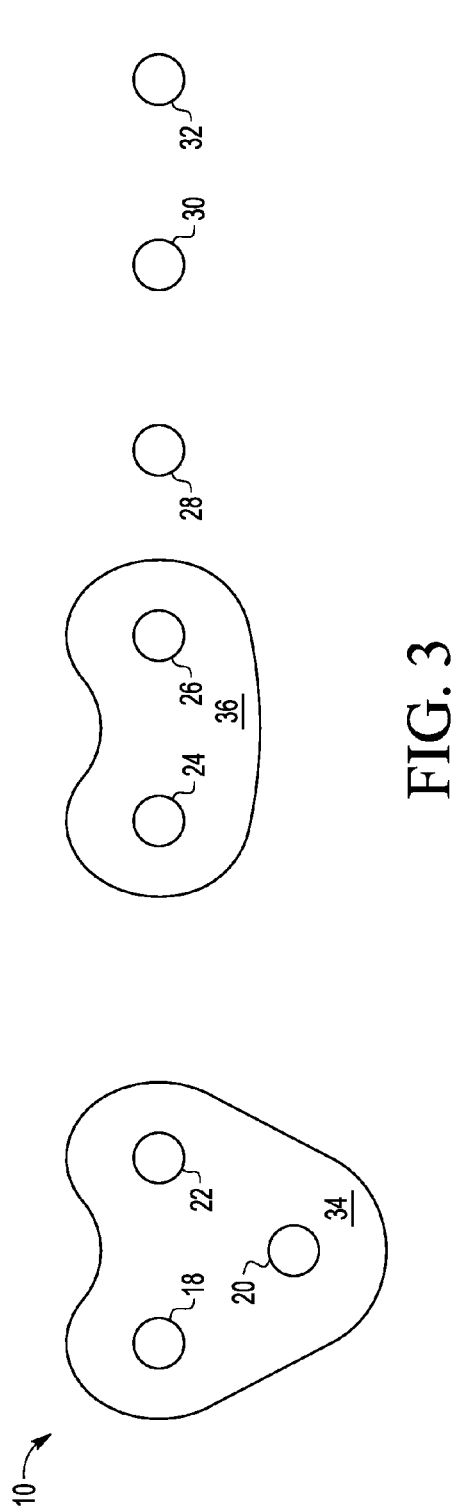
FIG. 3 is a cross section of the plurality wires of FIG. 2 at a subsequent stage in processing.

Shown in FIG. 3 is the portion of semiconductor device 10 of FIG. 2 after forming a dielectric layer 34 around wires 18, 20, and 22 and a dielectric layer 36 around wires 24 and 26. Wires 18, 20, and 22, which are in contact with and surrounded by the same dielectric layer, dielectric layer 34, are a subset of all of the wires that are wire bonded between integrated circuit 14 and package substrate 12. Wires 24 and 26, which are in contact with and surrounded by the same dielectric layer, dielectric layer 36, similarly form a different subset. Dielectric layers 34 and 36 may be formed by application of a liquid, that when hardened, is a dielectric material. This application may be by a machine that dispenses liquids. Such machines exist for the purpose of applying an insulator to all of the wires that are wire bonded between an integrated circuit and an underlying surface in order to ensure that the wires do not contact each other during injection of encapsulant or to provide a low k dielectric around all of the wires. The accuracy capability of wire bonding machines allows for precise contact to the wires so that the ability to apply a liquid selectively to individual wires or groups of wires is readily achieved. In the case of dielectric layers 34 and 36, the dielectric is relatively high compared to the encapsulant that will be applied. In the case of wires 18, 20, and 22 providing a pair of complementary signals, which may be called a differential pair, associated with a VSS reference, impedance matching is important and 100 ohms is the most commonly desired differential impedance to match. With the typical encapsulant, the differential impedance is typically substantially over a hundred. Increasing capacitance decreases the impedance. Thus with a higher dielectric constant for dielectric layer 34 relative to the dielectric constant of the encapsulant, capacitance is increased, and differential impedance is decreased. In the case of wires 24 and 26 providing a signal with associated VSS reference, commonly referred to as a single-ended signal, impedance matching is important and 50 ohms is the most commonly desired impedance to match. With the typical encapsulant, the impedance is typically substantially over fifty. Increasing capacitance decreases the impedance. Thus with a higher dielectric constant for dielectric layer 36 relative to the dielectric constant of the encapsulant, capacitance is increased and impedance is decreased. In the case of wires 24 and 26 providing a VDD power and associated VSS reference, increasing the capacitance and lowering the impedance is also beneficial. Dielectric layers 34 and 36 may be barium strontium titanate particle filler in an epoxy resin. The concentration of barium strontium titanate may be varied to vary the dielectric constant. The encapsulant typically has a dielectric constant around 4 whereas epoxy with barium strontium titanate filler is typically around 100. Thus there is a wide range of possible increases in capacitance for dielectric layers 34 and 36 in order to reach the desired impedance to optimize performance. The optimized impedance does not necessarily mean matching because factors in addition to matching are also relevant to performance. What is present in any region surrounding a subset can be considered a medium which may be a low or high k dielectric, encapsulant, or even vacuum.

Figure 4:
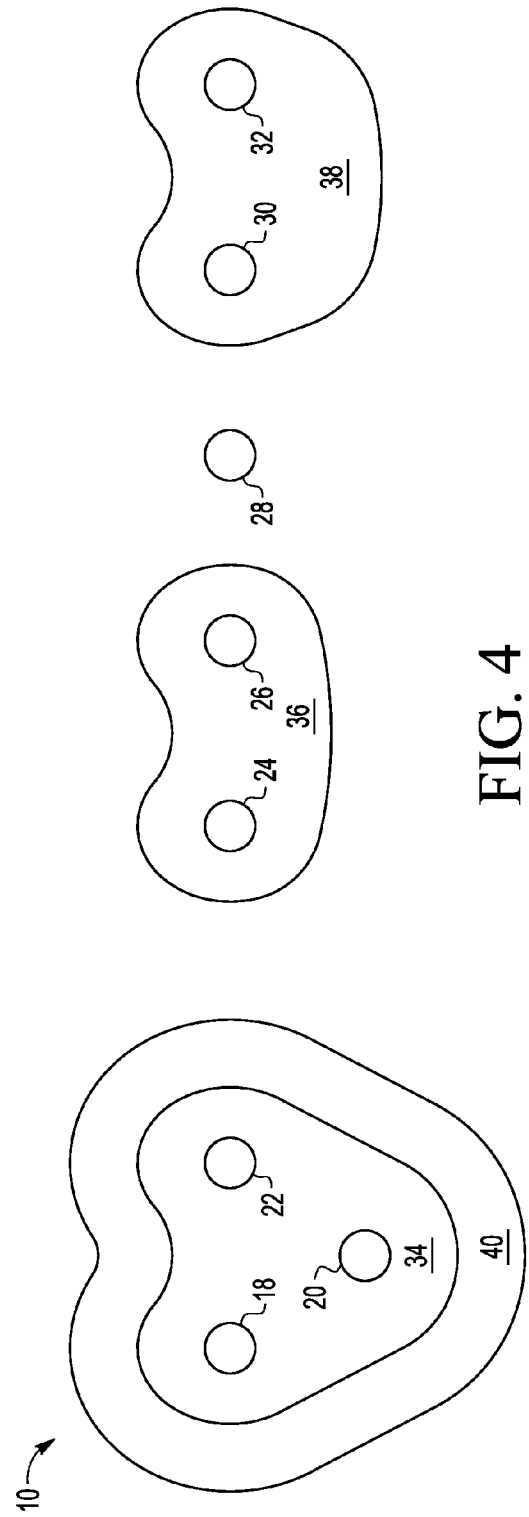
FIG. 4 is a cross section of the plurality wires of FIG. 3 at a subsequent stage in processing

Shown in FIG. 4 is the portion of semiconductor device 10 of FIG. 3 after forming a dielectric layer 38 around wires 30 and 32, which form a subset, and a dielectric layer 40 around dielectric layer 34. Dielectric layers 38 and 40 are low K dielectrics formed in the same way as dielectric layers 34, 36, and 38 but with a material that has a low dielectric constant, which in this context is one lower than the encapsulant. This is for reducing electromagnetic interference (EMI) to wires 18, 20, and 22 and to wires 30 and 32. An example of such a low K dielectric is a siloxane epoxy polymer. Wires 30 and 32 may be an example of a pair of conductors in which capacitive coupling is not desired. With low K dielectric layer 38 between them, capacitance between them is reduced. Also, there is some additional protection from EMI that originates external to semiconductor device 10 due to low K dielectric layer 38. Low K dielectric layer 38 may include a poregen material.

Figure 5:
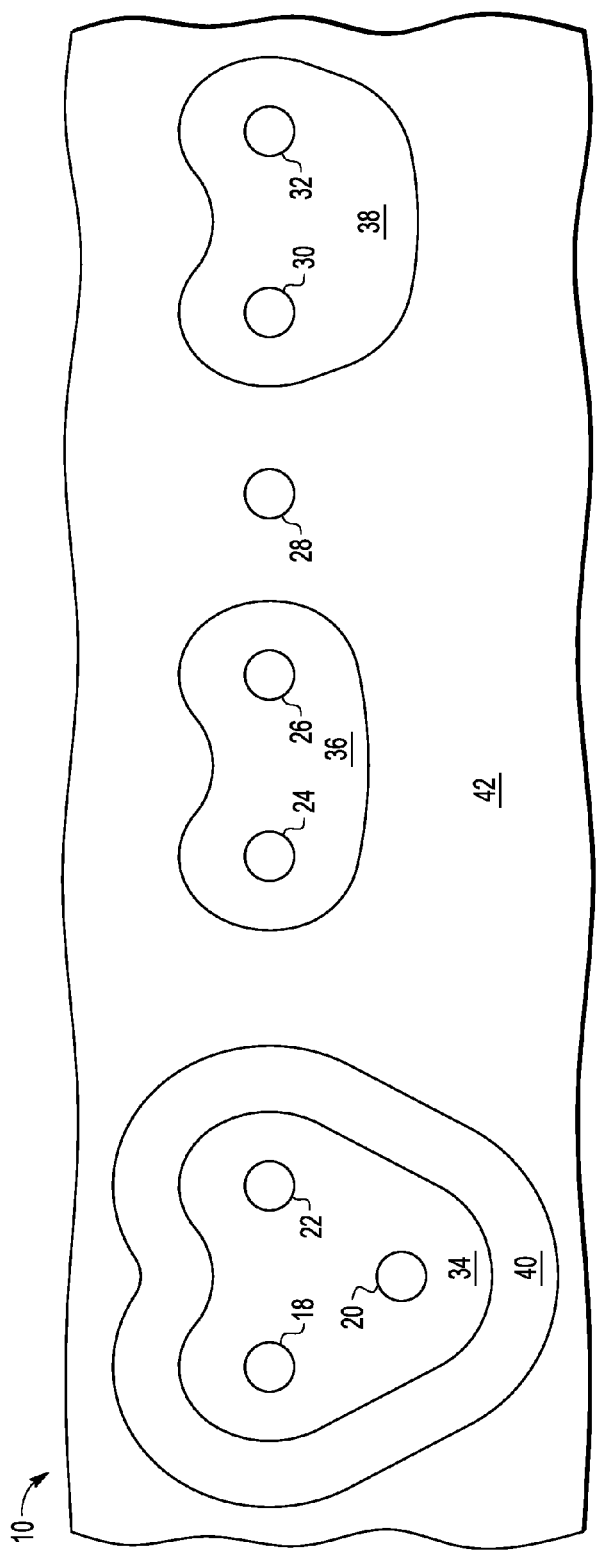
FIG. 5 is a cross section of the plurality wires of FIG. 4 at a subsequent stage in processing.

Shown in FIG. 5 is the portion of semiconductor device 10 of FIG. 4 after forming an encapsulant 42 around wire 28, low K dielectric 40, high K dielectric 36, and low K dielectric 38. This shows that wires, which are wire bonded between a package substrate and an integrated circuit, may be selectively in contact with a dielectric material that can be either higher K or lower K than the encapsulant or simply the encapsulant. Wire 28 is an example of being selected to be in contact with the encapsulant. Wires 18, 20, 22, 24, and 26 are in contact with the high k material. Wires 30 and 32 are in contact with the low K material. Wires 18, 20, and 22 are further surrounded by the low K material. All of the wires are all surrounded by encapsulant after the various low K and high dielectrics have been formed.

Figure 6:
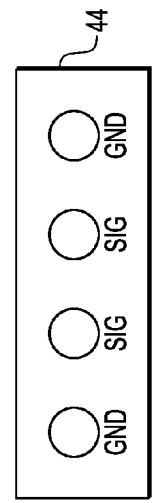
FIG. 6 is a cross section of configurations of wires additional to those shown in FIG. 5.
Figure 6:
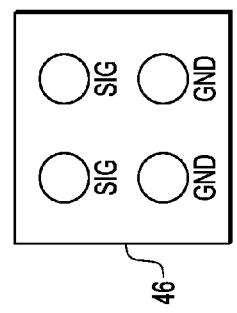

Shown in FIG. 6 are additional wire configurations 44 and 46 wire configurations that can be grouped together by being surrounded by the same layer of high or low K dielectric. Each such group can be considered a subset of the wires. Configuration 44 has four wires in-line that form a group with a common dielectric layer that is in contact with and surrounded by that common dielectric layer. Configuration 46 has two rows of two wires that form a group with another common dielectric layer in which the group of wires is in contact with and surrounded by that common dielectric layer. For each configuration 44 and 46, the group is selected for the particular dielectric layer that is in common for the group. Other wires and groups of wires may have a different kind of dielectric layer in which one possibility is that they will be surrounded and in contact with the encapsulant.

By now it should be appreciated that there has been provided a semiconductor device that includes a substrate. The semiconductor device further includes an integrated circuit die on the substrate. The semiconductor device further includes a first subset of wire bonds between the substrate and the integrated circuit die. The semiconductor device further includes a second subset of wire bonds between the substrate and the integrated circuit die. The semiconductor device further includes a dielectric material coating the first subset of the wire bonds along a majority of length of the first subset of the wire bonds. The semiconductor device further includes a medium in contact with the second subset of the wire bonds along a majority of length of the second subset of the wire bonds. The semiconductor device may have a further characterization by which the medium comprises one of a group consisting of a vacuum, air, and an encapsulating material. The semiconductor device may have a further characterization by which the first subset of the wire bonds includes one of a group consisting of one signal wire bond and one ground wire bond, a power wire bond and a ground wire bond, two signal wire bonds and one ground wire bond, and two signal wire bonds and two ground wire bonds. The semiconductor device may have a further characterization by which the dielectric material is one of a group consisting of a low-K dielectric material, a high-K dielectric material, and a combination of the low-K and high-K dielectric materials. The semiconductor device may have a further characterization by which capacitance of a combination of the first dielectric material and the first subset of the plurality of wire bonds is different from capacitance of the first subset of the plurality of wire bonds. The semiconductor device may have a further characterization by which the dielectric material electrically decouples the first subset of wire bonds from the second subset of wire bonds. The semiconductor device may have a further characterization comprising one of a group consisting of a first one of the wire bonds is positioned over a second one of the wire bonds, and a first one of the wire bonds is positioned adjacent a second one of the wire bonds. The semiconductor device may have a further characterization by which the medium comprises a second dielectric material, wherein the dielectric material and the second dielectric material are electrically decoupled from one another. The semiconductor device may have a further characterization by which the dielectric material includes a poregen material.

Also disclosed is a semiconductor device including a first surface and a second surface. The semiconductor device further includes a plurality of wire bonds between the first surface and the second surface. The semiconductor device further includes a dielectric material coating a first subset of the wire bonds, wherein properties of the dielectric material are different from a medium in contact with a second subset of the wire bonds so that the first subset of the wire bonds is electrically decoupled from a second subset of the plurality of wire bonds. The semiconductor device may have a further characterization comprising one of a group consisting of (1) the first surface is a first integrated circuit die and the second surface is a second integrated circuit die and (2) the first surface is an integrated circuit and the second surface is a substrate. The semiconductor device may have a further characterization by which the medium comprises one of a group consisting of the dielectric material, a second dielectric material, a vacuum, air, and an encapsulating material. The semiconductor device may have a further characterization by which the first subset of the wire bonds includes one of a group consisting of one signal wire bond and one ground wire bond, two signal wire bonds and two ground wire bonds, a power wire bond and a ground wire bond, and two signal wire bonds and one ground wire bond. The semiconductor device may have a further characterization by which the dielectric material comprises one of a group consisting of a low-K dielectric material, a high-K dielectric material, and a combination of the low-K and high-K dielectric materials. The semiconductor device may have a further characterization by which the dielectric material changes capacitance of the first subset of the wire bonds. The semiconductor device may have a further characterization by which a first one of the wire bonds is positioned over a second one of the wire bonds and the first one of the wire bonds is positioned laterally adjacent the second one of the wire bonds. The semiconductor device may have a further characterization by which the dielectric material includes a poregen material.

Disclosed also is a method for fabricating a semiconductor device in which the semiconductor device includes a plurality of wire bonds between a first set of contact pads and a second set of contact pads. The method includes dispensing a first dielectric coating on a first subset of the plurality of wire bonds, wherein the coating covers a majority of length of the first subset of the plurality of wire bonds and capacitance of a combination of the first dielectric coating and the first subset of the plurality of wire bonds is different from capacitance of the first subset of the plurality of wire bonds. The method may have a further characterization by which the first subset of the plurality of wire bonds includes one of a group consisting of one signal wire bond and one ground wire bond, two signal wire bonds and two ground wire bonds, a power wire bond and a ground wire bond, and two signal wire bonds and one ground wire bond. The method may further include dispensing a second dielectric coating on a second subset of the plurality of wire bonds, wherein the second dielectric coating covers more than a majority of length of the second subset of the plurality of wire bonds and capacitance of a combination of the second dielectric coating and the second subset of the plurality of wire bonds is different from capacitance of the second subset of the plurality of wire bonds.

Although the invention is described herein with reference to specific embodiments, various modifications and changes can be made without departing from the scope of the present invention as set forth in the claims below. For example, other configurations than those shown may be used and different combinations of low K and high K dielectrics may be used than those shown. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
a substrate;
an integrated circuit die on the substrate;
a first subset of wire bonds between the substrate and the integrated circuit die;
a second subset of wire bonds between the substrate and the integrated circuit die;
a dielectric material coating the first subset of the wire bonds along a majority of length of the first subset of the wire bonds, wherein the dielectric material includes a poregen material; and
a medium in contact with the second subset of the wire bonds along a majority of length of the second subset of the wire bonds.

2. The semiconductor device of claim 1, wherein:
the medium comprises one of a group consisting of a vacuum, air, and an encapsulating material.

3. The semiconductor device of claim 1, wherein:
the first subset of the wire bonds includes one of a group consisting of one signal wire bond and one ground wire bond, a power wire bond and a ground wire bond, two signal wire bonds and one ground wire bond, and two signal wire bonds and two ground wire bonds.

4. The semiconductor device of claim 1, wherein:
the dielectric material is one of a group consisting of a low-K dielectric material, a high-K dielectric material, and a combination of the low-K and high-K dielectric materials.

5. The semiconductor device of claim 1, wherein:
capacitance of a combination of the first dielectric material and the first subset of the plurality of wire bonds is different from capacitance of the first subset of the plurality of wire bonds.

6. The semiconductor device of claim 1, wherein:
the dielectric material electrically decouples the first subset of wire bonds from the second subset of wire bonds.

7. The semiconductor device of claim 1 having a further characterization comprising:
one of a group consisting of a first one of the wire bonds is positioned over a second one of the wire bonds, and a first one of the wire bonds is positioned adjacent a second one of the wire bonds.

8. The semiconductor device of claim 1, wherein:
the medium comprises a second dielectric material, wherein the dielectric material and the second dielectric material are electrically decoupled from one another.

9. A semiconductor device comprising:
a first surface;
a second surface;
a plurality of wire bonds between the first surface and the second surface; and
a dielectric material coating a first subset of the wire bonds, wherein properties of the dielectric material are different from a medium in contact with a second subset of the wire bonds so that the first subset of the wire bonds is electrically decoupled from a second subset of the plurality of wire bonds, wherein the dielectric material coats the first subset of the wire bonds for a majority of a length of the first subset of wire bonds, and wherein the dielectric material includes a poregen material.

10. The semiconductor device of claim 9, having a further characterization comprising:
one of a group consisting of (1) the first surface is a first integrated circuit die and the second surface is a second integrated circuit die and (2) the first surface is an integrated circuit and the second surface is a substrate.

11. The semiconductor device of claim 9, wherein:
the medium comprises one of a group consisting of the dielectric material, a second dielectric material, a vacuum, air, and an encapsulating material.

12. The semiconductor device of claim 9, wherein:
the first subset of the wire bonds includes one of a group consisting of:
- one signal wire bond and one ground wire bond,
- two signal wire bonds and two ground wire bonds,
- a power wire bond and a ground wire bond, and
- two signal wire bonds and one ground wire bond.

13. The semiconductor device of claim 9, wherein:
the dielectric material comprises one of a group consisting of a low-K dielectric material, a high-K dielectric material, and a combination of the low-K and high-K dielectric materials.

14. The semiconductor device of claim 9, wherein:
the dielectric material changes capacitance of the first subset of the wire bonds.

15. The semiconductor device of claim 9 further characterized by one of a group consisting of:
- a first one of the wire bonds is positioned over a second one of the wire bonds, and
- the first one of the wire bonds is positioned laterally adjacent the second one of the wire bonds.

16. A method for fabricating a semiconductor device, the semiconductor device includes a plurality of wire bonds between a first set of contact pads and a second set of contact pads, the method comprising:

dispensing a first dielectric coating on a first subset of the plurality of wire bonds, wherein the coating covers a majority of length of the first subset of the plurality of wire bonds and capacitance of a combination of the first dielectric coating and the first subset of the plurality of wire bonds is different from capacitance of the first subset of the plurality of wire bonds, and wherein the dielectric material includes a poregen material.

17. The method of claim 16 wherein:

the first subset of the plurality of wire bonds includes one of a group consisting of:

one signal wire bond and one ground wire bond, two signal wire bonds and two ground wire bonds, a power wire bond and a ground wire bond, and two signal wire bonds and one ground wire bond.

18. The method of claim 16 further comprising:

dispensing a second dielectric coating on a second subset of the plurality of wire bonds, wherein the second dielectric coating covers more than a majority of length of the second subset of the plurality of wire bonds and capacitance of a combination of the second dielectric coating and the second subset of the plurality of wire bonds is different from capacitance of the second subset of the plurality of wire bonds.

* * * * *